United States Patent
Jang

(10) Patent No.: US 7,300,848 B2
(45) Date of Patent: Nov. 27, 2007

(54) SEMICONDUCTOR DEVICE HAVING A RECESS GATE FOR IMPROVED RELIABILITY

(75) Inventor: Min Woo Jang, Kyoungki-do (KR)

(73) Assignee: Hynix Semiconductor Inc., Kyoungki-do (KR)

(*) Notice: Subject to any disclaimer, the term of this patent is extended or adjusted under 35 U.S.C. 154(b) by 164 days.

(21) Appl. No.: 11/287,594

(22) Filed: Nov. 28, 2005

(65) Prior Publication Data

US 2007/0004126 A1    Jan. 4, 2007

(30) Foreign Application Priority Data

Jun. 30, 2005    (KR) ............... 10-2005-0058602

(51) Int. Cl.
*H01L 21/26* (2006.01)
(52) U.S. Cl. .............. 438/302; 438/303; 438/305; 438/306; 438/524; 438/525; 438/527; 438/700
(58) Field of Classification Search ............ 438/301, 438/302, 303, 305, 306, 514, 524, 525, 527, 438/700, FOR. 188, FOR. 395, FOR. 403
See application file for complete search history.

(56) References Cited

U.S. PATENT DOCUMENTS

| | | | |
|---|---|---|---|
| 5,021,355 A | * | 6/1991 | Dhong et al. ............ 438/270 |
| 6,252,277 B1 | * | 6/2001 | Chan et al. ............ 257/330 |
| 2001/0039092 A1 | * | 11/2001 | Morimoto et al. ......... 438/270 |
| 2005/0205897 A1 | * | 9/2005 | Depetro et al. ............ 257/213 |
| 2006/0284225 A1 | * | 12/2006 | Popp et al. ............. 257/296 |
| 2006/0286757 A1 | * | 12/2006 | Power et al. ............ 438/305 |

FOREIGN PATENT DOCUMENTS

| KR | 1992-0022518 | 12/1992 |
|---|---|---|
| KR | 1019940002400 | 3/1994 |
| KR | 100137811 | 2/1998 |

OTHER PUBLICATIONS

Korean Patent Gazette, Jan. 2007.

* cited by examiner

*Primary Examiner*—George R. Fourson
*Assistant Examiner*—Joannie Adelle Garcia
(74) *Attorney, Agent, or Firm*—Ladas & Parry LLP

(57) ABSTRACT

A semiconductor device having a recess gate is formed by first forming a recess below the upper surface of the substrate. A spacer is formed at each sidewall of the recess. An impurity doping area is formed in a source area. A first LDD area is formed in a drain area. A gate comprising a gate insulating layer and a gate conductive layer is then formed in the recess. A second LDD area is formed on the upper surface of the semiconductor substrate. A gate spacer is formed at each sidewall of the gate. Then a source/drain area having an asymmetrical structure is formed on each side of the gate.

12 Claims, 7 Drawing Sheets

SEMICONDUCTOR DEVICE HAVING A RECESS GATE FOR IMPROVED RELIABILITY

BACKGROUND OF THE INVENTION

1. Field of the Invention

The present invention relates generally to a method of manufacturing a semiconductor device. More particularly, the present invention relates to a method of manufacturing a semiconductor device having a recess gate for improving reliability of the semiconductor device.

2. Description of the Prior Art

In general, as semiconductor devices are highly integrated, the gate channel lengths of the highly integrated semiconductor devices are significantly shortened. For this reason, the charge-sharing phenomenon frequently occurs between the source and drain areas of a gate (collectively referred to as the "source/drain area") contributing to degradation of the gate control function—this is known as a "short channel effect". Due to the short channel effect, a threshold voltage (Vt) is significantly lowered and a drain induced barrier lowering (DIBL) effect is generated, causing problems when the semiconductor devices are operated.

In addition, with increasing degree of high integration in a semiconductor device, more ions are excessively implanted into the source/drain area, and the depth of the source/drain area becomes shallow. This causes the spiking phenomenon and increases the parasitic series resistance. When the spiking phenomenon occurs, the source/drain area of a gate rarely performs its intended functions, because the silicon layer in a junction area is reacted with metallic materials when the source/drain area makes contact with the metallic materials.

In addition, since the thickness of the silicon layer of the junction area is thin, the resistance applied to the silicon layer is increased, so that the parasitic series resistance is also increased. If the parasitic series resistance is increased, the actual voltage difference between the source area and the drain area is reduced, so that a relatively high voltage is required for operating the semiconductor device.

In order to prevent the short channel effect and the spiking phenomenon and to lower the parasitic series resistance, various semiconductor fabrication technologies capable of lengthening an effective line width of a channel and enlarging the thickness of a silicon layer in the source/drain area have been developed.

For example, a recess gate forming technology and a buried gate forming technology are suggested by prior art. According to the recess gate forming technology, a recess is formed in a semiconductor substrate and a gate is formed in the recess, thereby enlarging the thickness of the silicon layer in the source/drain area. According to the buried gate forming technology, a gate is formed in the semiconductor substrate in such a manner that the thickness of a silicon layer in a junction area can be enlarged while lengthening the effective length of a channel.

Hereinafter, the conventional recess gate forming technology and the conventional buried gate forming technology will be briefly described.

FIGS. 1A and 1B are cross-sectional views for illustrating the procedure for manufacturing a semiconductor device through the conventional recess gate forming technology.

Referring to FIG. 1A, a pad oxide layer 2 and a pad nitride layer 3 are sequentially formed on a semiconductor substrate 1. Then, the pad nitride layer 3 and the pad oxide layer 2 are etched such that a gate area is exposed. After that, the exposed area of the semiconductor substrate 1 is locally thermal-oxidized through a local oxidation of silicon (LOCOS) process, thereby growing an oxide layer 4 as shown in FIG. 1A.

Referring to FIG. 1B, a portion of the oxide layer 4 is recessed by a predetermined depth. Then, a conductive layer 5 and a hard mask layer 6 are filled in the recessed area, thereby forming a gate 7. After that, the pad oxide layer 3 is removed, and a spacer 8 is formed at both sidewalls of the gate 7. Then, a source/drain ion implantation process is performed, thereby forming a source/drain area 9 below the upper surface of the semiconductor substrate 1 at each side of the gate 7.

After that, although not shown in the figures, other fabrication processes are subsequently performed to complete the semiconductor device fabrication.

FIG. 2 is a cross-sectional view for illustrating the procedure for manufacturing a semiconductor device through the conventional buried gate forming technology.

As shown in FIG. 2, after recessing a gate area of a semiconductor substrate 21 by a predetermined depth, a gate 24 including a gate insulating layer 22 and a gate conductive layer 23 is formed in the recessed area of the semiconductor substrate 21. Then, a source/drain ion implantation process is performed, thereby forming a source/drain area 25 on an upper surface of the semiconductor substrate 21 at both sides of the gate 24.

After that, a predetermined upper portion of the gate 24 and a predetermined portion of the semiconductor substrate 21 formed at both sides of the gate 24 are etched, and a capping insulating layer 26 is formed or "buried" in the etched area. The capping insulating layer 26 protects the gate 24 and insulates the source area from the drain area.

Then, although not shown in the figures, other fabrication processes are subsequently performed to complete the semiconductor device fabrication.

However, according to the conventional recess gate forming technique as in the case of FIGS. 1A-1B, the size of the step difference between the channel area and the source/drain area may depend on the amount of the semiconductor substrate 1, some of which constituting the channel area is lost when the oxide layer 4 is grown into the substrate 1. Thus, it is difficult to sufficiently enlarge the step difference size between the channel area and the source/drain area by utilizing the conventional recess gate forming techniques. Therefore, there are limitations to reduce the parasitic series resistance and spiking phenomenon. In addition, when the oxide layer 4 is grown through the LOCOS process, an unwanted deposition resembling a bird's beak (not shown) is formed at each of the end portions of the oxide layer, so there is limitation to reduce the line width of the gate.

As in the case of FIG. 2, although the conventional buried gate forming technology can effectively lengthen the effective line width of a gate 24, all of the overlap area of the gate, the insulating layer, and the silicon layer are enlarged at both sides of the gate, so the parasitic series resistance of a transistor fabricated through the conventional buried gate forming technology is higher than that of a transistor having a planar channel structure by at least 50%. Accordingly, an RC delay may occur in the semiconductor device fabricated through the conventional buried gate forming technology, so the semiconductor device fabricated through the conventional buried gate forming technology is not adaptable for high-speed operation.

In particular, according to the semiconductor device fabricated through the conventional buried gate forming technology, the thickness of the gate insulating layer may become thin at a gate edge, thereby causing the inferior gate induced drain leakage (GIDL) characteristics. In addition, since the electric field is dispersed at a channel edge part, it is difficult to realize the channel at the channel edge part, so that the parasitic series resistance may increase, thereby causing the inferior current characteristic.

Furthermore, the above-mentioned conventional techniques cannot efficiently restrict the punch-through phenomenon causing an undesired current flow between source/drain areas, so reliability of the semiconductor device, such as the operational characteristic of the semiconductor device, may be degraded.

SUMMARY OF THE INVENTION

Accordingly, the present invention has been made to solve the above-mentioned problems occurring in the prior art, and an object of the present invention is to provide a method of manufacturing a semiconductor device having a recess gate capable of effectively restricting a short channel effect while reducing the parasitic series resistance and spiking phenomenon.

Another object of the present invention is to provide a method of manufacturing a semiconductor device having a recess gate capable of preventing electric field dispersion at a channel edge part, thereby improving the current characteristics.

Still another object of the present invention is to provide a method of manufacturing a semiconductor device having a recess gate capable of improving reliability of the semiconductor device by restricting the punch-through phenomenon between source/drain areas.

In order to accomplish the above objects, the present invention provides a method of manufacturing a semiconductor device, the method comprising the steps of: forming a recess by recessing a gate area of a semiconductor substrate; forming a spacer at both sidewalls of the recess; forming an impurity doping area in a source area of the semiconductor substrate adjacent to the spacer by primarily implanting first conducive impurities through an inclined ion implantation scheme; forming a first LDD area in a drain area of the semiconductor substrate adjacent to the spacer by secondarily implanting second conducive impurities through an inclined ion implantation scheme; sequentially forming a gate insulating layer and a gate conductive layer on a resultant substrate; forming a gate by etching the gate conductive layer and the gate insulating layer; forming a second LDD area on an upper surface of the semiconductor substrate corresponding to both sides of the gate by performing an impurity ion implantation process with respect to the resultant substrate; forming a gate spacer at both sidewalls of the gate; and forming a source/drain area having an asymmetrical structure on the upper surface of the semiconductor substrate corresponding to both sides of the gate including the gate spacer.

According to the preferred embodiment of the present invention, the recess has a depth of about 500 to 1000 Å.

The method further comprises a step of performing a threshold voltage control ion implantation process after forming the recess and before the spacer has been formed at the sidewall of the recess.

The threshold voltage control ion implantation process is performed through an inclined ion implantation scheme with an inclination angle of about 10 to 20°.

In addition, the threshold voltage control implantation process is performed twice while rotating the semiconductor substrate by an angle of 180°.

The spacer is made from polysilicon and has a thickness of about 500 to 1500 Å.

The impurity doping area is formed by implanting p-type impurities with 1E18 to 5E18 ion/cm$^3$ dose through an inclined ion implantation scheme.

The first LDD area is formed by implanting n-type impurities with 1E18 to E20 ion/cm$^3$ dose through an inclined ion implantation scheme.

The method further comprises a step of recessing an exposed bottom surface of the recess after step the spacer is formed at the sidewall of the recess and before the primary ion implantation process has been performed or after the primary ion implantation process is performed step and before the gate insulating layer and gate conductive layer have been sequentially formed.

The exposed bottom surface of the recess is recessed by a thickness of about 300 to 500 Å.

The method further comprises a step of performing the threshold voltage control ion implantation process after recessing the exposed bottom surface of the recess and before the gate insulating layer and the gate conductive layer are sequentially formed.

The ion implantation process for forming the second LDD area is carried out through an inclined ion implantation scheme.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION OF EMBODIMENTS

FIGS. 3A to 3G are cross-sectional views for illustrating the procedure for manufacturing a semiconductor device according to one embodiment of the present invention.

Figure 3A:
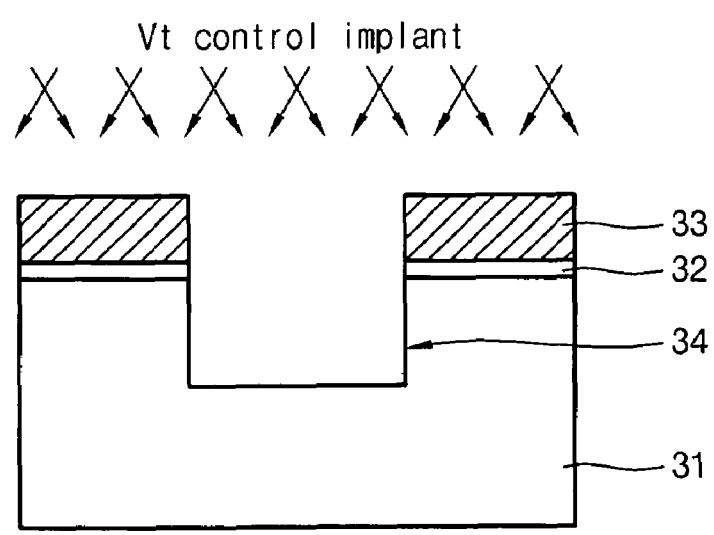
FIGS. 3A to 3G are cross-sectional views for illustrating the procedure for manufacturing a semiconductor device according to one embodiment of the present invention.

Referring to FIG. 3A, a pad oxide layer 32 having a thickness of about 50 to 100 Å is formed on a semiconductor substrate 31, and a pad nitride layer 33 having a thickness above 1500 Å is formed on the pad oxide layer 32. Then, the pad nitride layer 33 and the pad oxide layer 32 are etched, thereby exposing a gate area of the semiconductor substrate 31. After that, the exposed portion of the semiconductor substrate 31 is etched by a thickness of about 500 to 1000 Å by using the etched pad nitride layer 33 as an etching barrier, thereby forming a recess 34.

Then, a threshold voltage (Vt) control implantation process is performed with respect to the resultant substrate having the recess 34 at the gate area, to increase the boron concentration on the sidewall of the recess channel. For example, the threshold voltage control implantation process is performed twice through an inclined ion implantation scheme using $BF_2$ under a process condition including an energy of 10 to 30 keV, a concentration of 1.0E16 to 1.0E17 ions/cm$^2$ and under an inclination angle of about 10 to 20° while rotating the semiconductor substrate 31 by an angle of 180°.

Figure 3B:
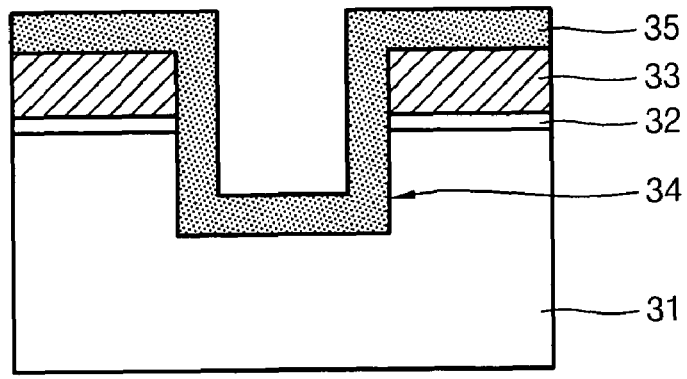

Referring to FIG. 3B, an undoped polysilicon layer 35 with a thickness of about 500 to 1500 Å is conformally deposited on the entire surface of the resultant substrate including the recess 34.

Figure 3C:
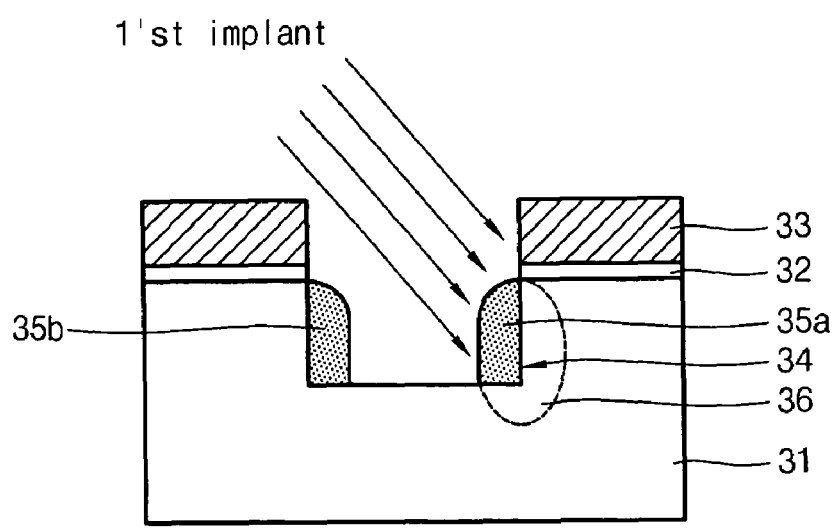

Referring to FIG. 3C, the undoped polysilicon layer 35 is anisotropically etched, thereby forming a polysilicon spacers 35a, 35b at the sidewalls of the recess 34. After that, p-type impurities are primarily implanted into a source area of the semiconductor substrate 31 adjacent the polysilicon spacer 35a by performing an ion implantation process with respect to the resultant substrate through an inclined ion implantation scheme, thereby forming a p-type impurity doping area 36. Herein, the primary ion implantation, which is the halo ion implantation, is performed while implanting the p-type impurities with 1E18 to 5E18 ion/cm$^3$ dose. At this time, the p-type impurities must not be implanted into the area of the semiconductor substrate 31 that is exposed to the exterior and formed between the polysilicon spacers 35a and 35b.

Figure 3D:
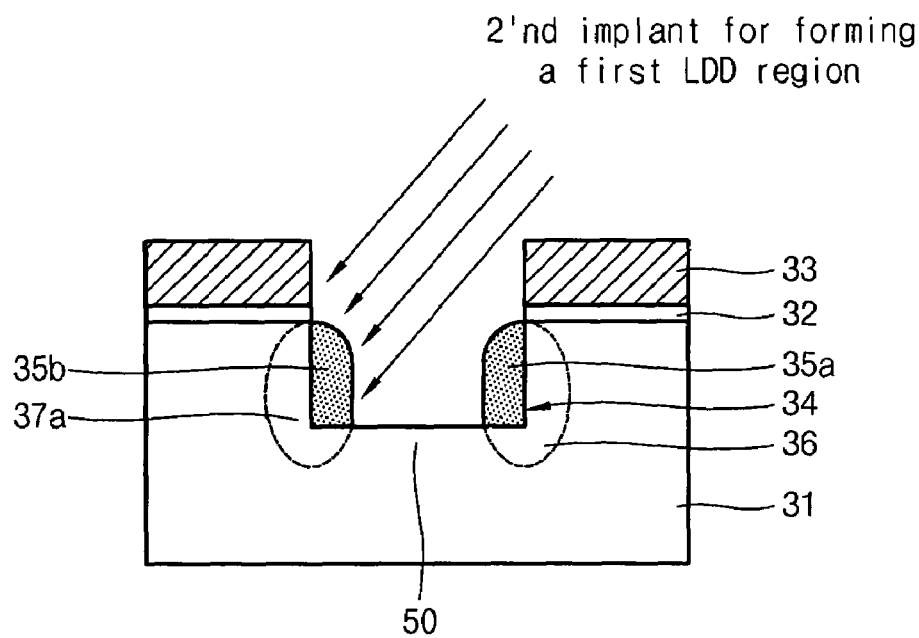

Referring to FIG. 3D, n-type impurities are secondarily implanted into a drain area of the semiconductor substrate 31 adjacent the polysilicon spacer 35b by performing an ion implantation process with respect to the resultant substrate through an inclined ion implantation scheme, thereby forming a first lightly doped drain (LDD) area 37a. Herein, the secondary ion implantation for forming the first LDD area 37a is performed while implanting the n-type impurities with 1E18 to 1E20 ion/cm$^3$ dose. At this time, the n-type impurities must not be implanted into the area of the semiconductor substrate 31 that is exposed to the exterior and formed between the polysilicon spacers 35a and 35b.

As described above, according to the present invention, the p-type impurity doping area 36 is formed in the source area of the semiconductor substrate 31 by performing the primary ion implantation process through the inclined ion implantation scheme, and the first LDD area 37a is formed in the drain area of the semiconductor substrate 31 by performing the secondary ion implantation process through the inclined ion implantation scheme. At this time, the p-type impurity doping area 36 and the first LDD area 37a are adjacent the channel area 50 of the semiconductor substrate 31.

Accordingly, the p-type impurity doping area 36 formed in the source area of the semiconductor substrate 31 may restrict the punch-through phenomenon between the source/drain areas and prevent the off leakage current by reducing the electric field of the source area. In addition, the first LDD area 37a formed in the drain area of the semiconductor substrate 31 may compensate for the electric field dispersion at the edge part of the channel so that the channel characteristics cannot be degraded at the edge part of the channel. As a result, the channel resistance can be lowered, thereby improving the current flow characteristics.

Figure 3E:
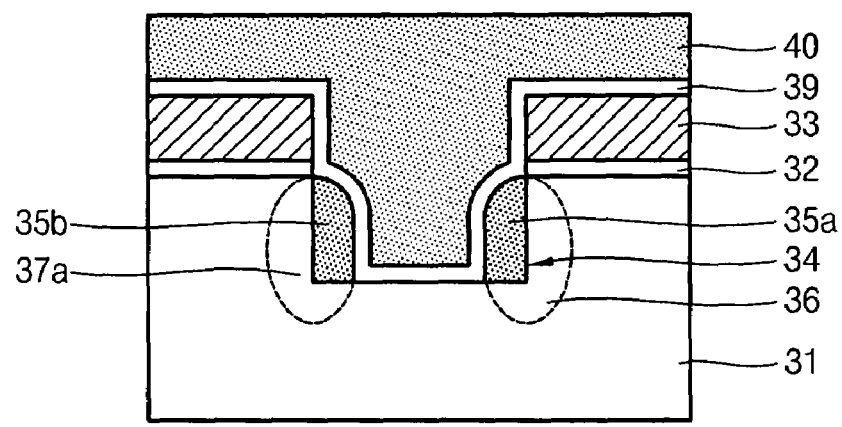
Figure 3F:
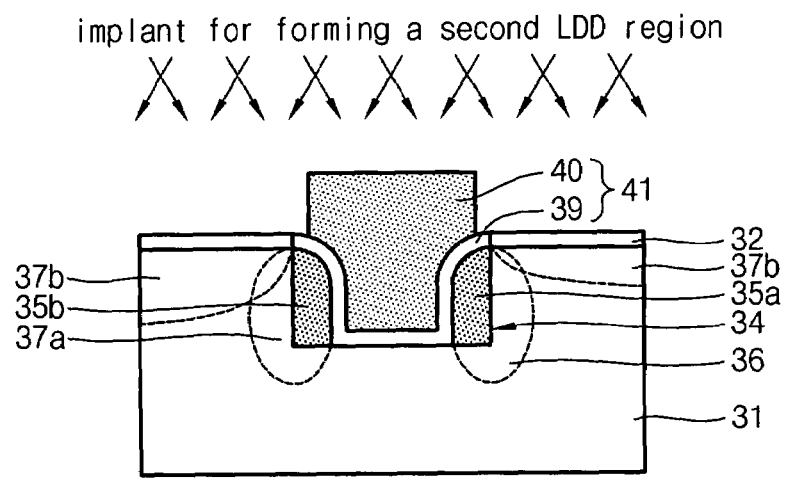

Referring to FIG. 3E, a gate insulating layer 39 and a gate conductive layer 40 are sequentially formed on the entire surface of the resultant substrate including the recess 34.

Still referring to FIG. 3E, a chemical mechanical polishing (CMP) process is performed with respect to the gate conductive layer 40 and the gate insulating layer 39 such that the pad nitride layer 33 is exposed to the exterior. Then, the exposed pad nitride layer 33 is removed, and now referring to FIG. 3F, so that a gate 41 including the gate insulating layer 39 and the gate conductive layer 40 is formed. When removing the pad nitride layer 33, the predetermined portion of the gate insulating layer 39 formed at the sidewall of the pad nitride layer is also removed.

After that, n-type impurities are implanted into the resultant substrate through an inclined ion implantation scheme with an inclination angle above 15° by using the gate 41 as an ion implantation barrier, thereby forming a second LDD area 37b in the upper surface of the semiconductor substrate corresponding to each of the both sides of the gate 41.

Figure 3G:
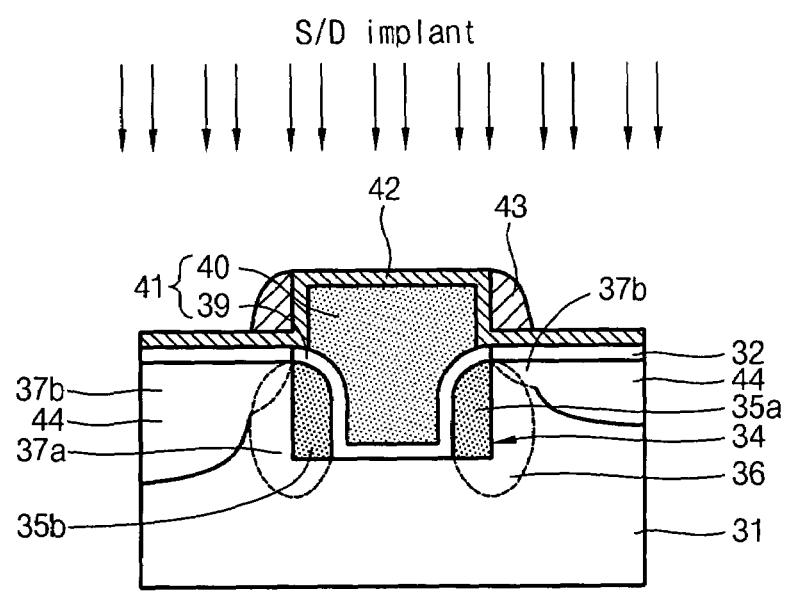

Referring to FIG. 3G, a capping insulating layer 42 which comprises a nitride layer having on the lower surface thereof an oxide layer is deposited on the entire surface of the resultant substrate including the gate 41 in order to protect the gate 41. Then, a gate spacer 43 consisting of an oxide layer and a nitride layer is formed at both sidewalls of the gate 41 surrounded by the capping insulating layer 42. After that, a source/drain ion implantation process is performed with respect to the resultant substrate by implanting n-type impurities, thereby forming a source/drain area 44 at the upper surface of the semiconductor substrate 31 corresponding to the both sides of the gate 41 including the gate spacer 43.

At this time, as shown in FIG. 3G, the source/drain area 44 has an asymmetrical structure, in which the drain junction area (near the polysilicon spacer 35b) has a depth greater than the depth of the source junction area (near the polysilicon layer 35a).

Figure 1A:
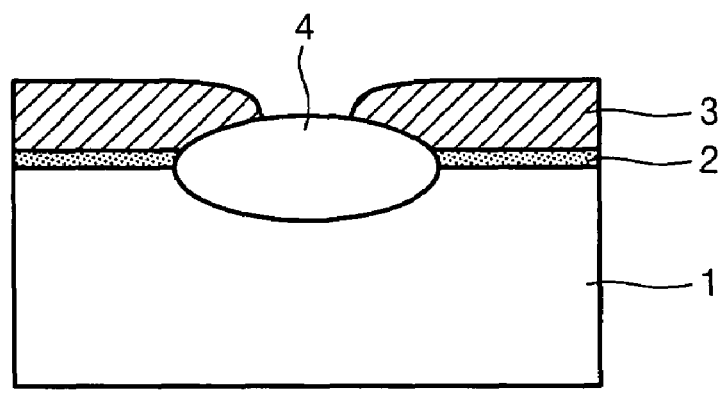
FIGS. 1A and 1B are cross-sectional views for illustrating the procedure for manufacturing a semiconductor device through a conventional recess gate forming technology.
Figure 1B:
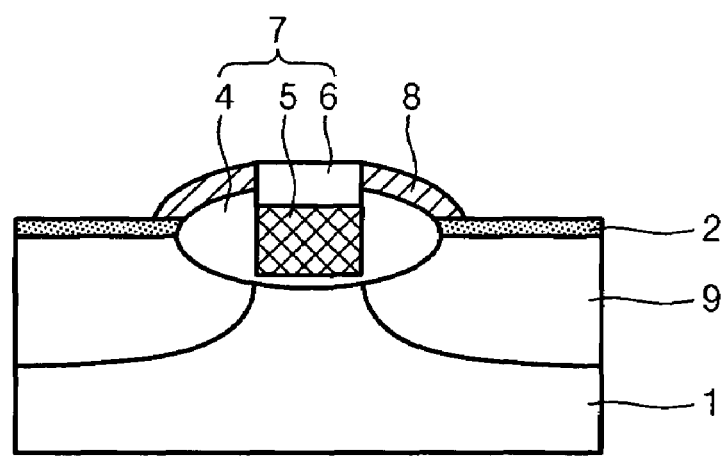
Figure 2:
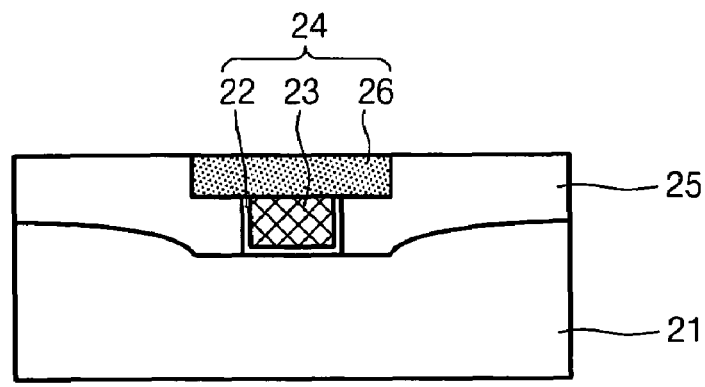
FIG. 2 is a cross-sectional view for illustrating the procedure for manufacturing a semiconductor device through a conventional buried gate forming technology.

Therefore, according to the present invention, the recess is formed by recessing the gate area (such as 34, FIG. 1) of the semiconductor substrate, the p-type impurity doping area (i.e., a halo ion implantation area) is formed in the source area (such as 36, FIG. 3C), and the first LDD area (such as 37a, FIG. 3D) is formed in the drain area, thereby forming the recess gate (such as 41, FIG. 3F) including the asymmetrical junction areas.

Thus, according to the present invention, the thickness of the silicon layer of the junction area and the channel length can be enlarged, so that not only is the parasitic series resistance effectively reduced, but also the spiking phenomenon and the short channel effect, such as the DIBL, can be restricted. In addition, the present invention can restrict the punch-through phenomenon between the source/drain areas while reducing the off leakage current and the channel resistance, thereby improving the current characteristic of the semiconductor device.

After that, although not shown in the figures, other fabrication processes are subsequently performed to complete the semiconductor device fabrication.

FIGS. 4A to 4D are cross-sectional views for illustrating the procedure for manufacturing a semiconductor device according to another embodiment of the present invention. Hereinafter, the procedure for manufacturing the semiconductor device according to another embodiment of the present invention will be described, in which the same reference numerals will be used throughout the embodiments of the present invention to refer the same or like parts.

Figure 4A:
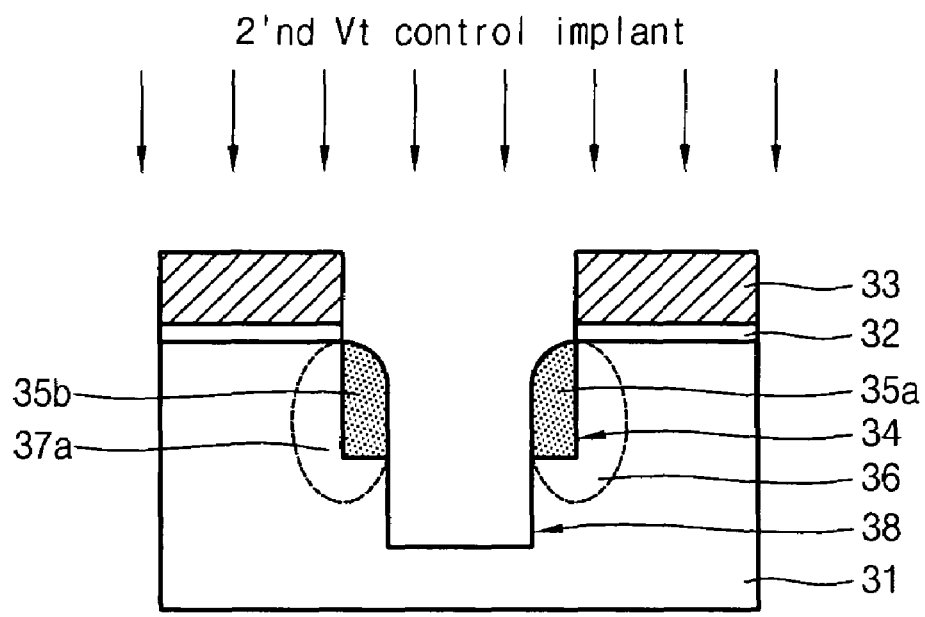
FIGS. 4A to 4D are cross-sectional views for illustrating the procedure for manufacturing a semiconductor device according to another embodiment of the present invention.

Before referring to FIG. 4A, a semiconductor substrate 31 obtained by performing the processes shown in FIG. 3A to 3D is prepared. Accordingly, the semiconductor substrate 31 has the recess 34 formed at the sidewall thereof with the polysilicon spacer 35a, the p-type impurity doping area 36 formed in the source area adjacent to the polysilicon spacer 35a by primarily implanting the p-type impurities, and the first LDD area 37a formed in the drain area by secondarily implanting n-type impurities. In this embodiment, the recess 34 (such as that shown in FIG. 3D) will be referred to as a first recess 34 to provide clarity.

After that, now referring to FIG. 4A, the bottom surface of the first recess 34 is recessed, thereby forming a second recess 38 having the width narrower than the width of the first recess 34. The second recess 38 has a depth of about 300 to 500 Å. The depth of the first recess 34 is about 500 to 1000 Å. Then, the threshold voltage (Vt) control ion implantation process is performed with respect to the resultant substrate having the second recess 38, to increase the boron concentration in the lower main recess channel and thereby adjust the threshold voltage. The threshold voltage control ion implantation process is the secondary ion implantation process, which is performed after the first recess 34 has been formed through the primary ion implantation process. The threshold voltage control implantation process is performed through an inclined ion implantation scheme using $BF_2$ under a process condition including an energy of 20 to 40 keV, a concentration of 1.0E17 to 1.0E18 ions/cm$^2$ and without tilt angle.

Figure 4B:
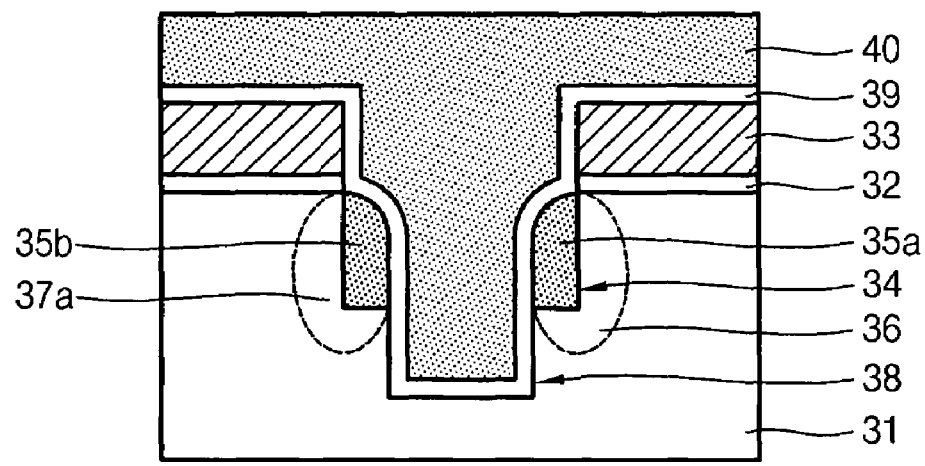
Figure 4C:
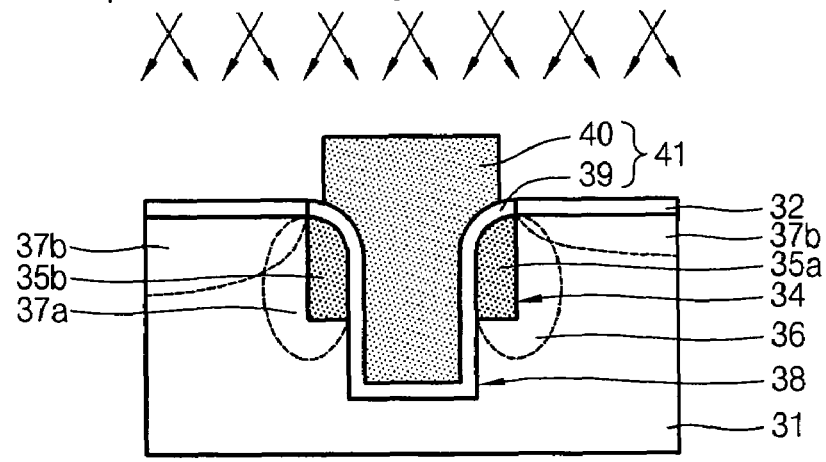

Referring to FIG. 4B, after forming the gate insulating layer 39 on the entire surface of the resultant substrate including the second recess 38, the gate conductive layer 40 is formed such that the first and second recesses 34 and 38 are filled with the gate conductive layer 40.

Still referring to FIG. 4B, the CMP process is performed with respect to the gate conductive layer 40 and the gate insulating layer 39 such that the pad nitride layer 33 is exposed to the exterior. Then, the pad nitride layer 33 is removed, thereby forming the gate 41 (now referring to FIG. 4C,) including the gate insulating layer 39 and the gate conductive layer 40.

After that, n-type impurities are implanted into the resultant substrate through an inclined ion implantation scheme with an inclination angle above 15° by using the gate 41 as an ion implantation barrier, thereby forming the second LDD area 37b in the upper surface of the semiconductor substrate corresponding to both sides of the gate 41.

Figure 4D:
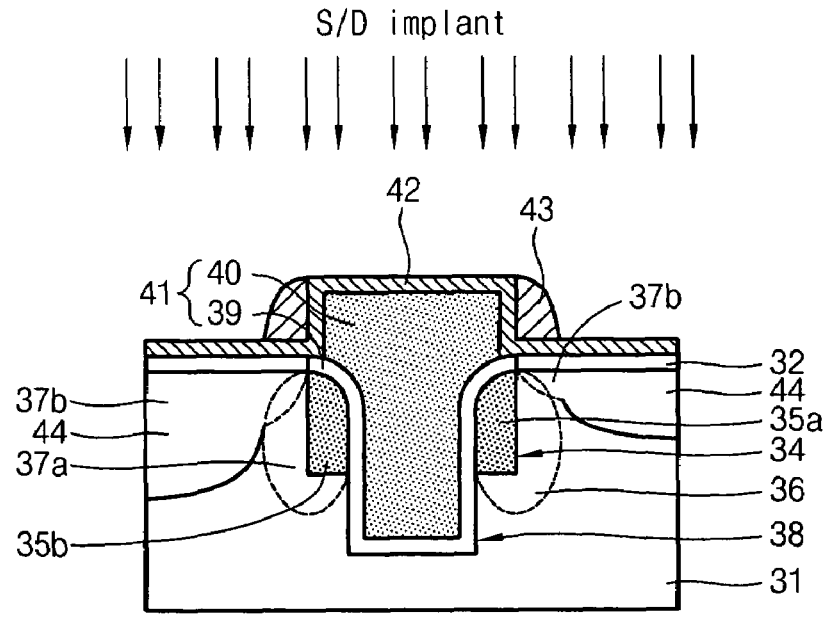

Referring to FIG. 4D, after depositing the capping insulating layer 42 on the entire surface of the resultant substrate including the gate 41, the gate spacer 43 is formed at both sidewalls of the gate 41 surrounded by the capping insulating layer 42. Then, a source/drain ion implantation process is performed with respect to the resultant substrate by implanting n-type impurities, thereby forming the source/drain area 44 at the upper surface of the semiconductor substrate 31 corresponding to the both sides of the gate 41 including the gate spacer 43. At this time, as shown in FIG. 4D, the structure of the source/drain areas 44 is asymmetrical, in which the drain junction area has a depth greater than that of the source junction area.

After that, although not shown in the figures, other fabrication processes are subsequently performed to complete fabrication of the semiconductor device of the present invention.

According to another embodiment of the present invention, as described above, the second recess 38 is formed at the bottom surface of the first recess 34, so that the charge-sharing phenomenon can be restricted between the source/drain areas (such as 44) by means of the second recess 38, thereby reducing the punch-through phenomenon and lengthening the effective length of the channel.

In addition, if the second recess 38 is formed at the bottom surface of the first recess 34, the final length of the channel can be easily controlled by adjusting the thickness of the polysilicon spacer 35a formed at both sidewalls of the first recess 34 and the depth of the second recess 38, so the characteristics of the semiconductor device can be easily controlled.

Furthermore, according to another embodiment of the present invention, the primary and secondary impurity implantation processes are performed through the inclined ion implantation scheme for controlling the threshold voltage of the channel. Accordingly, the density of the impurity can be easily controlled at an overlap area between the channel area and the junction area, so that the short channel effect can be effectively prevented.

As described above, according to the present invention, the recess is formed by recessing the gate area of the semiconductor substrate, the p-type impurity doping area (the halo ion implantation area) is formed in the source area of the semiconductor substrate, and the LDD area is formed in the drain area of the semiconductor substrate, thereby forming the recess gate including the junction area having the asymmetrical structure. Therefore, the present invention can enlarge the thickness of the silicon layer in the junction area and lengthen the effective length of the channel, thereby effectively reducing the parasitic series resistance while restricting the spiking phenomenon and the short channel effect, such as the DIBL. In addition, the present invention can effectively restrict the punch-through phenomenon between the source/drain areas while reducing the off leakage current and the channel resistance, thereby improving the characteristics of the semiconductor device.

In addition, according to the present invention, the final length of the channel can be easily controlled by adjusting the thickness of the polysilicon spacer formed at both sidewalls of the first recess and the depth of the second recess, so the characteristics of the semiconductor device can be easily controlled.

Furthermore, when the present invention is used for fabricating the semiconductor device, such as a LOGIC circuit device or a transistor provided at a peripheral area of a DRAM, in which one gate line is formed in one active area, a mask process is not required when performing the ion implantation processes for forming the halo ion implantation area in the source area and the LDD area in the drain area, so that the manufacturing processes for the semiconductor device can be simplified.

In addition, since the second recess is formed at the bottom surface of the first recess in the gate area of the semiconductor substrate, the punch-through phenomenon can be effectively restricted and the effective length of the channel can be lengthened. Furthermore, according to the present invention, the primary and secondary impurity implantation processes are performed for controlling the threshold voltage of the channel, so that the density of the impurity can be easily controlled at the overlap area between the channel area and the junction area. Thus, the short channel effect can be effectively prevented.

Although a preferred embodiment of the present invention has been described for illustrative purposes, those skilled in the art will appreciate that various modifications, additions and substitutions are possible, without departing from the scope and spirit of the invention as disclosed in the accompanying claims.

What is claimed is:

1. A method of manufacturing a semiconductor device, the method comprising the steps of:
   i) forming a first recess having two sidewalls in an area below a upper surface of a semiconductor substrate, wherein a source area of a gate is defined at or near one recess sidewall and a drain area of the gate is defined at or near the other recess sidewall;

ii) forming a recess spacer in the recess contacting each recess sidewall, wherein the recess spacer is made from polysilicon;

iii) forming an impurity doping area in the source area of the semiconductor substrate by implanting first conductive impurities through an inclined ion implantation process, wherein the first conductive impurities are implanted in the source area at an angle through the recess;

iv) forming a first lightly doped drain(LDD) area in the drain area by implanting second conductive impurities through an inclined ion implantation process, wherein the second conductive impurities are implanted in the drain area at an angle through the recess;

v) forming the gate comprising a gate insulating layer formed on surfaces of the recess and recess sidewalls and a gate conductive layer formed on the gate insulating layer such that the gate having two gate sidewalls extends above the upper surface of the semiconductor substrate;

vi) implanting impurity ion on the upper surface of the semiconductor substrate corresponding to each side of the gate by performing an impurity ion implantation;

viii) forming a gate spacer at each sidewall of the gate; and ix) forming a second source area in the source area and a second drain area in the drain area by implanting impurity ions in the source and drain areas, wherein the depths of the source and drain areas in the semiconductor substrate are asymmetrical.

2. The method as claimed in claim 1, wherein the first recess has a depth of about 500 to 1000 Å.

3. The method as claimed in claim 1, further comprising a step of performing a threshold voltage control ion implantation process after step i) and before step ii).

4. The method as claimed in claim 3, wherein the threshold voltage control ion implantation process is performed through an inclined ion implantation scheme with an inclination angle of about 10 to 20°.

5. The method as claimed in claim 4, wherein the threshold voltage control implantation process is performed twice while rotating the semiconductor substrate by an angle of 180°.

6. The method as claimed in claim 1, wherein the recess spacer has a thickness of about 500 to 1500 Å.

7. The method as claimed in claim 1, wherein the impurity doping area is formed by implanting p-type impurities with 1E18 to 5E18 ion/cm$^3$ dose through an inclined ion implantation scheme.

8. The method as claimed in claim 1, wherein the first LDD area is formed by implanting n-type impurities with 1E18 to E20 ion/cm$_3$ dose through an inclined ion implantation scheme.

9. The method as claimed in claim 1, further comprising a step of forming a second recess below the first below by further recessing an exposed bottom surface of the first recess after step ii) and before step iii) or after step iii) and before step v).

10. The method as claimed in claim 9, wherein the depth of the second recess is about 300 to 500 Å.

11. The method as claimed in claim 9, further comprising a step of performing the threshold voltage control ion implantation process after recessing the exposed bottom surface of the recess and before the gate insulating layer and the gate conductive layer are sequentially formed.

12. The method as claimed in claim 1, wherein the ion implantation process for forming a second LDD area is carried out through an inclined ion implantation scheme.

* * * * *